Feb. 18, 1969 C. M. DAVIS 3,428,870

SEMICONDUCTOR DEVICES

Filed July 29, 1965

INVENTOR:
CALVIN M. DAVIS,
BY Urban H. Faubion
HIS ATTORNEY.

United States Patent Office 3,428,870

Patented Feb. 18, 1969

3,428,870

SEMICONDUCTOR DEVICES

Calvin M. Davis, Auburn, N.Y., assignor to General Electric Company, a corporation of New York Filed July 29, 1965, Ser. No. 475,775

U.S. Cl. 317—234 7 Claims

Int. Cl. H01l 3/00, 5/00

Figure 1:
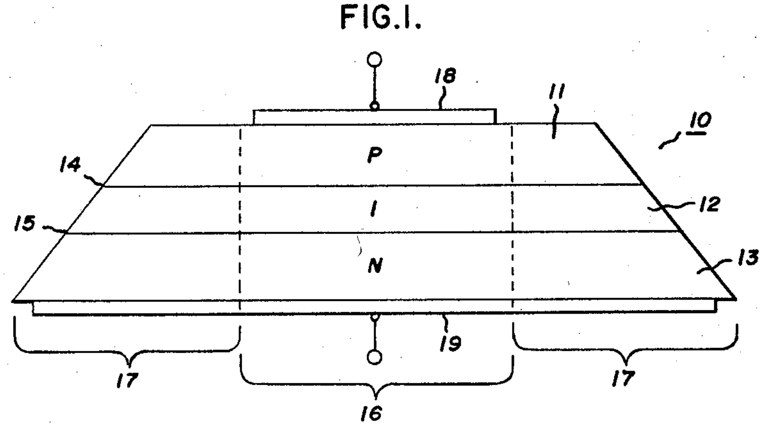

This invention relates to a means for improving the characteristics of semiconductor materials which have at least one internal junction between two zones of different conduction characteristics and the characteristics of devices which utilize such materials. More specifically, the invention is directed toward means for increasing the reverse or inverse voltage which may be applied to such devices without a breakdown and to increase the ability of such devices to dissipate power when the device does break down in the reverse direction. Reverse, or inverse, voltage as used here is a voltage which is of a polarity that would normally cause conduction to take place across a given junction in the direction of high impedance.

A junction between zones of a semiconductor material having opposite type conduction characteristics provides a low resistance path to an electric current flowing across the junction in one direction, and a high resistance path to current flow in the opposite direction. A voltage which is of such a polarity as to force a current across the junction in the direction of higher resistance is the inverse voltage referred to above. When an inverse voltage is applied across the junction between zones of semiconductor material having an excess of free electrons (N type conduction characteristics) and an excess of positive holes (P or positive conduction characteristics) respectively, the region surrounding the junction becomes deficient of free electrons and positive holes (known as carriers). The reason that this happens is that when a positive voltage is applied at the negative type conduction zone and a negative voltage applied at the positive type conduction zone, the positive carriers are attracted to the negative voltage terminal and the negative carriers are attracted to the positive voltage terminal. Thus, the carriers on both sides of the junction are attracted away from the junction to form a region (called the depletion region). The depletion region is a dielectric because of the deficiency of carriers of either type.

The dielectric depletion region is highly resistive and is capable of withholding high voltages. For example, in most practical devices, the dielectric depletion region is capable of withstanding a reverse voltage of several hundred volts without breaking down through the bulk of the material. However, most devices are not capable of withstanding more than a relatively small fraction of the voltage which the bulk will hold in the reverse direction (either transient or steady state) due to the fact that breakdown first occurs across or around the surface. For this reason, it is said that most such devices are surface limited.

The fact that most rectifiers are surface limited places severe limitations on the usefulness of the devices. To began with, it means that the device cannot be used in circuits where reverse voltages (either steady state or transient) of over a few hundred volts are likely to occur without taking special precautions (frequently elaborate) to prevent application of the reverse voltage directly across the device.

As serious as this drawback appears, it is perhaps not as serious as other disadvantages which occur because such devices are surface limited; viz, device instability, and destruction of the device upon surface breakdown in the reverse direction.

Device instability is most frequently due to the fact that the condition of the semiconductor surface changes. The characteristics of such devices vary considerably with the condition of the surface. Therefore, unless some precautions are taken to assure that the surface condition will not change appreciably during the use of the device, the device stability is very poor. Actually it is much more difficult to control condition of the surface of the material than it is to control the characteristics of the bulk and it is centainly more difficult to control or prevent changes in surface condition than to control the essentially constant bulk characteristics. The fact of the matter is that even with elaborate precautions such as utilizing various kinds of surface treatment and placing the semiconductor material in an evacuated hermetically sealed container, the predominant failure mechanism of rectifier devices during operation is a result of surface degradation.

As to the point concerning device destruction, it is a well recognized fact that typical rectifiers (which are surface limited devices) may be permanently damaged or destroyed by only a few watts of power absorbed during breakdown, as from a very brief voltage transient, in the reverse or blocking direction. The fact that the bulk material can dissipate a great deal of energy is readily apparent by taking as an example a typical silicon rectifier and considering that such devices can, at least momentarily, dissipate 1000 watts of heat in the forward direction of current flow without any damage whatsoever. This apparent anamoly can be explained by considering the fact that for conduction in the forward direction, current and its attendant heat losses spread out equally over the entire junction area, permitting maximum utilization of the entire rectifier cooling mechanism and its thermal capacity. However, in the reverse direction, the rectifier surface current under momentary high blocking voltage peaks finds some microscopic flaw or weakness at which to concentrate. Such weak spots usually occur at the junction surface where the rectifying junction emerges from the silicon pellet. At these minute spots, a fraction of a watt of concentrated heat may be sufficient to melt and destroy the blocking properties of the rectifier, regardless of size of the rectifier. The inverse voltage problem is so critical that transient rating in the reverse direction is done on the basis of voltage rather than energy.

When failure due to reverse voltage applied to the rectifier takes place through the bulk of the material instead of over the surface, the device can dissipate approximately as much energy, both steady state and transient, in its reverse direction as in its forward direction. When the device breaks down through the bulk and current flows in the reverse direction, the breakdown is called "avalanche breakdown" (sometimes mistakenly called "Zener breakdown"). Avalanche breakdown of a silicon rectifier diode is an inherent nondestructive characteristic that is widely used at relatively low power and voltage levels as a constant voltage reference and regulator in so called "Zener" diodes. Like a Zener diode, a rectifier operated within its thermal limitations maintains substantially constant voltage across it in the avalanche region regardless of current in this region. As long as the current is limited by the external circuit to the thermal capability of the device, no damage results from true avalanche action. Hence, a device with uniform avalanche breakdown occurring at a voltage below that at which local dielectric surface breakdowns occur, can dissipate hundreds of times more reverse energy with transient overvoltage conditions than one where the converse is true.

Perhaps it is well to point out that breakdown is likely to occur at the surface of the semiconductor material because of the high voltage gradient at the surface of the device. Stated in another way, breakdown occurs at the surface due to high concentration of electric fields at the surface. As a practical matter, the place where the electric field is usually of the highest intensity is in the vicinity of the junction between the two zones of opposite conduction type characteristics. For example, the transition region or junction between the two different conduction zones may be on the order of $10^{-3}$ centimeters in thickness. Thus, it is readily seen that a very strong electric field (high electric field intensity) occurs at a surface area of the body intercepted by the junction.

With these facts in mind, the objects of the present invention can be fully appreciated. For example, it is an object of the present invention to provide a semiconductor device wherein breakdown due to reverse voltage occurs within the bulk of the material of the semiconductor material instead of at the surface. Another object of the invention is to provide a semiconductor device capable of wide application without the necessity of providing protective devices which prevent high reverse voltages. Still another object of the invention is to provide a semiconductor device with surface stability problems largely eliminated.

An approach which has met many of these objects has been to provide a semiconductor pellet with a central region in which carrier multiplication through avalanche breakdown occurs initially and another outer surrounding region which, in effect, controls or determines the effect of surface conditions on the device. In general, such approaches have resulted in lowering the voltages at which the one portion of the device breaks down. If this voltage is lowered sufficiently, breakdown almost always occurs in the avalanche mode, however, the voltage which the device will hold off (block) may be so low and reverse leakage currents so high as to render the device useless for high voltage applications.

Accordingly, it is an object of the present invention to provide a semiconductor rectifying device using the above described approach to insure breakdown in the bulk rather than over the surface (called controlled avalanche) by raising the magnitude of surface breakdown voltage rather than lowering bulk breakdown voltage.

In copending application "Semiconductor Device," Ser. No. 255,037 filed Jan. 30, 1963, in the name of Robert L. Davies and Gerald C. Huth and assigned to the assignee of the present invention, this object is accomplished by contouring the outer periphery of the semiconductor pellet. The proper contours for various pellets are well defined in that application. One of the most commonly used pellet structures of the type described in the Davies et al. application supra for high voltage rectifiers involves using at least three layers in the semiconductor pellet with one internal layer having a high resistivity relative to the other layers. For example, a high voltage diode pellet would have outer layers of P and N conductivity types respectively and an internal layer of much higher resistivity. The internal layer may be considered intrinsic or very slightly doped with either P or N type carriers. This is the general type of structure contemplated here.

Previous approaches to obtain high voltage rectifiers which consistently break down in the bulk and the structure contemplated here involves selecting the specific resistivity of the semiconductor metal on the basis of the high resistivity portion necessary to establish the breakover voltage required and then selecting the thickness of the internal high resistivity region on the basis of a compromise to obtain specific desired parameters. For example, the high resistivity region should be made thin in order to insure low forward voltage drops and low reverse currents (particularly at high temperatures). At the same time, this region must be made thick enough to prevent surface breakdown even with the contoured surfaces.

Thus, the object of the present invention includes avoidance of these difficulties by providing an approach to obtaining bulk breakdown which permits use of high resistivity semiconductor metal having inherently high "after diffusion" lifetime characteristics, thus, improving reverse current characteristics at high temperature, e.g. about 200° C. range and renders forward voltage drop characteristics essentially independent of high voltage surface breakdown characteristics (1200 to 3000 volts).

Another approach to accomplishing these objects is found in the copending application Ser. No. 393,290 entitled "Semiconductor Devices" filed Aug. 31, 1964 in the name of Calvin M. Davis and Robert L. Davies and assigned to the assignee of the present invention. The present application provides an alternate approach which represents an improvement in that it provides devices and a method for fabricating such devices which devices are simpler and less expensive by virtue of the method.

In carrying out the invention, a rectifying semiconductive device is provided which has a semiconductor pellet with three or more layers of material having different average resistivities. One of the layers is of high resistivity material relative to the other two. The layer of high resistivity is provided with a center region or zone in which carrier multiplication through avalanche occurs initially and an outer region which surrounds the inner region. Bulk breakdown through the inner region prior to a surface breakdown is assured by making the resistivity of the center zone less than that of the outer zone which surrounds it. The main current carrying electrodes of the device are ohmically connected to the outer layers.

Figure 2:
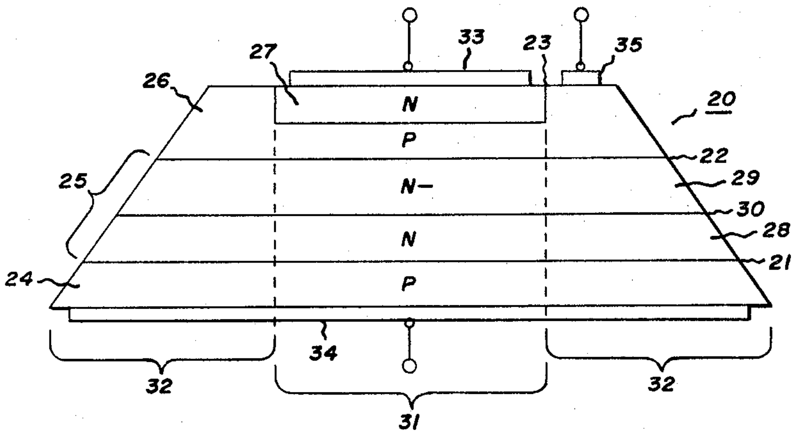

The novel features which are believed to be characteristic of the invention are set forth with particularity in the appended claims. The invention itself, however, both as to its organization and method of operation together with further objects and advantages thereof may best be understood by reference to the following description taken in connection with the accompanying drawing in which:

FIGURE 1 is a central vertical section through a segment of semiconductor rectifier pellet which utilizes teachings of the present invention and which is used to define terms and concepts of the present invention; and FIGURE 2 is a central vertical section through a semiconductor pellet used in connection with controlled rectifiers which utilizes teachings of the present invention.

In FIGURE 1, the cross-section of a pellet 10 of single crystal semiconductive material such as silicon or germanium is depicted in a somewhat diagrammatic fashion. The pellet for many practical semiconductor devices will be circular so that it has the general shape of a round coin but it may have any other shape. The pellet 10 illustrated has 3 regions or layers of different resistivities. As illustrated, the upper layer 11 is a highly doped low resistivity region of P type conductivity, an inner layer 12 of high resistivity material and a lower layer 13 of N type material which is highly doped. Thus, there is a central layer 12 of higher resistivity (here shown as intrinsic although in the device it is slightly P type and it may have P or N type conductivity) separating two low resistivity layers 11 and 13 of opposite conductivity types; the transitions 14 and 15 from the high resistivity inner layer 12 to each of the low resistivity outer layers 11 and 13 respectively may be abrupt and are substantially planar. These transitions 14 and 15 are called junctures between layers. A juncture is also considered a junction (rectifying) when the transition is between layers of different conductivity type.

A central zone 16 of internal layer 12 of the pellet 10 plays a predominant role in establishing the device characteristics other than surface breakdown. The internal intrinsic layer is designed by conventional means to provide the rectifier characteristics desired. That is, the total thickness of internal layer 12, the resistivity of central zone 16 of internal layer 12, the thickness of individual layers 11 and 13 and relative impurity concentrations of the various layers are selected to give the desired characteristics. The resistivity and thickness of inner intrinsic layer 12 in the central zone 16 are in the device shown, selected so that the depletion region spreads across both junctures 14 and 15.

The effect of surface conditions on device operation is minimized by providing an outer peripheral zone 17 of internal layer 12 which surrounds the inner zone 16. The resistivity of the outer zone 17 of inner layer 12 is much higher than that of the central zone 16. Since the outer zone 17 of inner layer 12 does not determine device conduction characterisics, it is designed with the specific object of preventing surface breakdown. In one particular device, the outer zone 17 of inner layer 12 is composed of material having a resistivity of about 300 ohm centimeters while the resistivity of the central zone 16 of layer 12 is about 100 ohm centimeters.

The pellet 10 as illustrated may be formed by starting with monocrystalline bulk material (e.g., silicon) in rod form (e.g., a right circular cylinder). The rod may have the resistivity desired for central zone 16 of internal layer 12. For example, for the device illustrated the rod might be of intrinsic or lightly doped P type, one inch in diameter and have a resistivity of 100 ohm centimeters. The rod is then out diffused (or diffused) with a compensating type material to form an outer peripheral zone of higher resistivity material (e.g., 300 ohm centimeters) about ¼ inch in thickness. The outer peripheral zone eventually forms the outer zone 17 of inner layer 12. The rod is then sliced into circular or disk shaped pellets (about 12 mils thick). Using this material, the pellet 10 illustrated is formed by diffusing in an N type impurity (Phosphorous) to form the lower N type layer 13 which is 2.5 mils thick and which has a surface impurity concentration $N_s$ of about $10^{21}$ atoms per cubic centimeter. The upper P type region is diffused in to a depth of about 2 mils and has a surface impurity concentration about $10^{19}$ atoms per cubic centimeter (Boron diffused). The internal layer 12 of bulk material is about 7.5 mils thick. Ohmic contacts (18 and 19) are applied to the upper and lower major faces respectively of the pellet so that a voltage can be applied.

In order further to enhance the ability of the pellet 10 to withstand surface breakdown, the periphery of the pellet 10 may be contoured or beveled in accordance with teaching of the Davies, Huth application previously referred to. Devices with a witholding capability of 1200 to 2000 volts which will break down in the bulk rather than over the surface are obtained.

The same general principles apply to devices with more layers. For example, in FIGURE 2 a pellet 20 for a silicon controlled rectifier is shown which employs the principles of the present invention. The operation of the silicon controlled rectifier illustrated is not described in detail here since a complete understanding of the operation of the device is not essential to an understanding of the invention and, further, the operation of such devices is discussed in a number of other places which are easily accessible. For example, the operation is described in Chapter 1 of the General Electric Controlled Rectifier Manual, copyright 1960, by the General Electric Company. For our purposes, it should suffice to say that the part of the device which provides the rectifying and control action is the disc-shaped rectifying semiconductor pellet 20.

The semiconductor pellet 20 is a monocrystalline semiconductor material (silicon in the device illustrated) with three junctions 21, 22 and 23 between four major layers 24, 25, 26 and 27 which are of alternate conduction types. That is, the four layers alternately have an excess of free electrons (N type conduction characteristics) and an excess of positive holes (positive or P type conduction characteristics). The internal N type layer 25 is actually made up of two sublayers or zones 28 and 29 which are of the same conductivity type (and, therefore, called a single layer) but which have different impurity concentration levels. The different impurity concentration levels are indicated by the letter N- on zone 29 to designate low impurity concentration level and N on zone 28 which indicates a higher impurity concentration. A juncture 30 is shown on the figure to indicate an abrupt difference in impurity concentrations.

The central zone 31 of internal N-layer 29 plays a predominant role in establishing device characteristics other than surface breakdown and an outer peripheral zone 32 of internal layer 29 which surrounds the central zone 31 and establishes surface breakdown characteristics. The total thickness of the internal layer 29 and the thickness and the relative impurity concentration of individual layers are selected to give the desired device characteristics. In this embodiment the internal N-conductivity type layer 29 has a high resistivity relative to the other layers and in this sense corresponds to the I type internal layer 12 of the PIN device of FIGURE 1.

The outer zone 32 of internal layer 29 is made predominant in determining surface breakdown properties by making it of higher resistivity than in the inner zone 31. For example, the resistivity of the outer zone 32 of internal layer 29 may be at least three times as great as that of the inner zone 31. Since outer region 32 does not appreciably affect device conduction characteristics, it is designed with the specific object of preventing surface breakdown. In order further to enhance the ability of the pellet 20 to withstand surface breakdown, the periphery may be contoured or beveled in accordance with teachings of the Davies, Huth copending application, supra.

The particular pellet illustrated is made starting with a cored pellet of semiconductor material 800 mils (a little more than ¾ inch) in diameter and 9 mils thick with a central zone ⅜ inch in diameter having N- conduction characteristics desired for the central zone 31 of inner N-type layer 29 (e.g., about 40 ohm centimeters) and a surrounding peripheral region or zone 32 of about 120 ohm centimeters. The pellet is cut from a cored rod formed as previously described. The upper P type region is diffused (by boron or gallium) to a depth of about 2.5 mils and has a surface concentration of about $7\times10^{18}$ atoms per cubic centimeter. The upper and lower N type layers 27 and 28 respectively are then diffused in (with proper masking) to form layers about 1.5 mils thick and surface concentrations of about $1\times10^{21}$ atoms per cubic centimeter. The lower surface is then etched off until the lower N type layer 28 has a surface concentration of about $1\times10^{17}$ atoms per cubic centimeter. The lower P type layer 24 is put on to a thickness of 1.5 mils as by epitaxial deposition and has an impurity concentration of about $1\times10^{20}$ atoms per cubic centimeter.

In order to provide for device circuit connections, an anode ohmic contact 34 is applied on the lower surface of the pellet 20, a cathode ohmic contact 33 is provided on the upper surface within central region 31 and a gate ohmic contact 35 is applied to internal P type layer 26. Notice that the upper cathode contact 33 is only applied to the central region 31 so that the major current path between anode and cathode 34 and 33 is in the central region.

While particular embodiments of the invention have been shown and described, it will, of course, be understood that the invention is not limited thereto since many modifications varied to fit particular operating requirements and environments will be apparent to those skilled in the art. The invention may be used to perform similar functions and its peculiar properties taken advantage of in semiconductor devices utilizing other materials than those described and such devices formed in other ways without departing from the concept of the invention. Accordingly, the invention is not considered limited to the example chosen for the purposes of disclosure and it is contemplated that the appended claims will cover any such modifications as fall within the true spirit and scope of the invention.

What I claim as new and desire to secure by Letters Patent of the United States is:

1. A semiconductor device including a semiconductor body having at least first and second layers of opposite conductivity type contiguous with and separated by a third layer, said third layer being of uniform thickness, in parallel relation with said first layer and said second layer along their contiguous planes, and having first and second zones each contiguous with said first and second layers, said first zone comprising a central part of said third layer and said second zone comprising a peripheral part of said third layer surrounding said first zone, said second zone having a higher resistivity than said first zone.

2. A semiconductor device as defined in claim 1 wherein said third layer is of the same conductivity type as one of said first and second layers.

3. A semiconductor device as defined in claim 1 wherein individual ohmic contacts are provided on the external surfaces of said first and second layers to form a rectifier.

4. A semiconductor device as defined in claim 1 wherein said third layer is essentially intrinsic.

5. A semiconductor device as defined in claim 4 wherein individual ohmic contacts are provided on external surfaces of said first and second layers thereby to form a semiconductor rectifier.

6. A semiconductor device including a semiconductor body having first and second layers of opposite conductivity type contiguous with and separated by a third layer being of uniform thickness, in parallel relation with said first layer and said second layer along their contiguous planes, and having first and second zones each contiguous with said first and second layers, said first zone comprising a central part of said third layer and said second zone comprising a peripheral part of said third layer surrounding said first zone, said second zone having a higher resistivity than said first zone, a fourth layer contiguous with said second layer and of opposite conductivity type thereto forming an external layer of said semiconductor body, a fifth layer contiguous with a portion of said first layer and of opposite conductivity type thereto, said fifth layer and a portion of said first layer forming a second external layer of said semiconductor body, and individual ohmic contacts connected to said external layers of said second layer, said portion of first layer having an external layer, and said fifth layer.

7. The method of forming semiconductor devices comprising: exposing a body of semiconductor material of desired conductivity type and resistivity to a temperature sufficient to form a central zone in said body extending between two external surfaces and a peripheral zone of higher resistivity surrounding said central zone and extending between said two external surfaces and then forming layers of opposite conductivity type at opposite external surfaces of, in parallel relation with, and contiguous with both said central zone and said peripheral zone of said semiconductor body.

References Cited

UNITED STATES PATENTS

| | | | |
|---|---|---|---|
| 2,792,540 | 5/1957 | Pfann | 317—235 |
| 3,012,305 | 12/1961 | Ginsbach | 29—25.3 |
| 3,034,079 | 5/1962 | Uhlir | 333—98 |
| 3,260,902 | 7/1966 | Porter | 317—235 |
| 3,287,182 | 11/1966 | Köhl | 148—33.5 |
| 3,312,881 | 4/1967 | Yu | 317—235 |

JOHN W. HUCKERT, *Primary Examiner.*

R. F. POLISSACK, *Assistant Examiner.*

U.S. Cl. X.R.

317—235; 148—33.5, 186